(12) United States Patent
Kawawa et al.

(10) Patent No.: US 12,002,662 B2
(45) Date of Patent: Jun. 4, 2024

(54) ELECTROSTATIC ATTRACTION DEVICE AND NEUTRALIZATION METHOD

(71) Applicant: TOKYO ELECTRON LIMITED, Tokyo (JP)

(72) Inventors: Takahiro Kawawa, Yamanashi (JP); Hideomi Hosaka, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 322 days.

(21) Appl. No.: 17/598,191

(22) PCT Filed: Mar. 13, 2020

(86) PCT No.: PCT/JP2020/011126
§ 371 (c)(1),
(2) Date: Sep. 24, 2021

(87) PCT Pub. No.: WO2020/195959
PCT Pub. Date: Oct. 1, 2020

(65) Prior Publication Data
US 2022/0174803 A1 Jun. 2, 2022

(30) Foreign Application Priority Data
Mar. 26, 2019 (JP) .................................. 2019-058070

(51) Int. Cl.
*H01J 37/32* (2006.01)
*H01L 21/683* (2006.01)
*H05F 3/00* (2006.01)

(52) U.S. Cl.
CPC .... *H01J 37/32724* (2013.01); *H01L 21/6833* (2013.01); *H05F 3/00* (2013.01); *H01J 2237/2007* (2013.01)

(58) Field of Classification Search
CPC ....................... H01L 21/6833; H01J 37/32724
See application file for complete search history.

(56) References Cited

U.S. PATENT DOCUMENTS

2015/0000842 A1* 1/2015 Hirano .............. H01L 21/76802
307/26
2016/0198528 A1* 7/2016 Kitagawa .......... H01L 21/67109
156/345.52

FOREIGN PATENT DOCUMENTS

JP 2004-47512 A 2/2004
JP 2008047564 A * 2/2008 ........... G02F 1/1303

OTHER PUBLICATIONS

PCT International Search Report and Written Opinion, PCT Application No. PCT/JP2020/011126, dated Jun. 9, 2020, 8 pages (with English translation of PCT International Search Report).

* cited by examiner

*Primary Examiner* — Scott Bauer
(74) *Attorney, Agent, or Firm* — Fenwick & West LLP

(57) ABSTRACT

There is provided an electrostatic attraction device having an electrostatic chuck in which an electrode and a heater are embedded in a dielectric. The device comprises: a DC power source unit having a DC power source configured to supply a DC power to the electrode; a first neutralizing circuit connected to a power supply path between the DC power source and the electrode; and a second neutralizing circuit connected to a power supply path between the first neutralizing circuit and the electrode. The first neutralizing circuit has a first ground relay that connects and disconnects the electrode and the ground via a voltage-drop resistance member, and the second neutralizing circuit has an isolation relay that connects and disconnects the first neutralizing circuit and the second neutralizing circuit, and a second ground relay that is connected to a power supply path between the isolation relay and the electrode and connects and disconnects the electrode and the ground side without going through a resistance member.

8 Claims, 3 Drawing Sheets

US 12,002,662 B2

ELECTROSTATIC ATTRACTION DEVICE AND NEUTRALIZATION METHOD

TECHNICAL FIELD

The present disclosure relates to an electrostatic attraction device and a neutralization method.

BACKGROUND

Patent Document 1 discloses an electrostatic attraction device including: a dielectric having therein an electrode and to which an object to be attracted is attracted by an electrostatic force when a DC voltage is applied to the electrode; a temperature measuring device for measuring a temperature of the object to be attracted; and an attracted state determining device for monitoring a temperature profile of the object to be attracted measured by the temperature measuring device and determining an attracted state of the object to be attracted and the dielectric based on the monitored temperature profile.

Patent Document 1: Japanese Patent Application Publication No. 2004-47512

SUMMARY

The technique of the present disclosure performs appropriate neutralization on an electrostatic chuck disposed on a substrate support on which a substrate is placed.

One aspect of the present disclosure provides an electrostatic attraction device having an electrostatic chuck in which an electrode and a heater are embedded in a dielectric, comprising: a DC power source unit having a DC power source configured to supply a DC power to the electrode; a first neutralizing circuit connected to a power supply path between the DC power source and the electrode; and a second neutralizing circuit connected to a power supply path between the first neutralizing circuit and the electrode, wherein the first neutralizing circuit has a first ground relay that connects and disconnects the electrode and the ground via a voltage-drop resistance member, and the second neutralizing circuit has an isolation relay that connects and disconnects the first neutralizing circuit and the second neutralizing circuit, and a second ground relay that is connected to a power supply path between the isolation relay and the electrode and connects and disconnects the electrode and the ground side without going through a resistance member.

Effect of the Invention

In accordance with the present disclosure, it is possible to perform appropriate neutralization on an electrostatic chuck disposed on an substrate support on which a substrate is placed.

DETAILED DESCRIPTION

Figure 1:
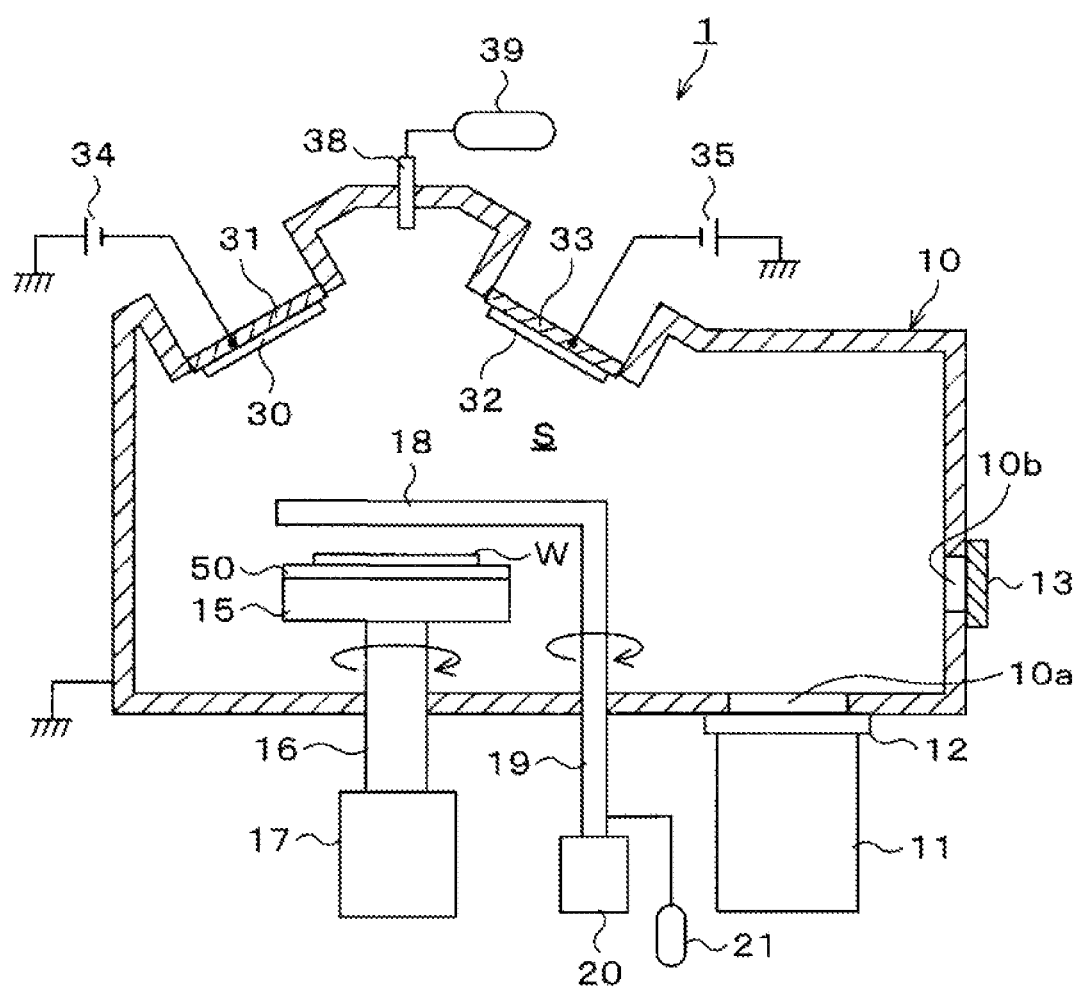
FIG. 1 explains a schematic configuration of a film forming apparatus including an electrostatic attraction device according to an embodiment.

In a semiconductor device manufacturing process, an attraction member using an electrostatic force, which is referred to as an electrostatic chuck, is used as a structure for holding a substrate such as a semiconductor wafer (hereinafter referred to as "wafer") or the like at a predetermined position on a substrate support. Since the attraction member attracts and holds the substrate using the electrostatic force, it can be used even in a vacuum state. Therefore, it is used in a plasma processing apparatus such as a film forming apparatus, a plasma etching apparatus, or the like.

The electrostatic chuck disclosed in Patent Document 1 includes a dielectric and a pair of electrodes disposed at a substrate support. The dielectric is made of an insulating material such as ceramic, resin, or the like. A substrate is attracted by the electrostatic force generated on a backside of the substrate and a placement surface of the dielectric by applying DC voltages having different polarities to the pair of electrodes. The electrodes are embedded in the dielectric, and a heater for heating the substrate to a predetermined temperature is embedded in the dielectric.

In the case of transferring a wafer from the substrate support, in order to release the attraction by the electrostatic chuck, the application of the DC voltages to the electrodes is stopped. Further, in order to remove residual charges, the electrostatic chuck disclosed in Patent Document 1 is connected to a DC power source when a power supply switch is on and is connected to the ground side and grounded in a power feeder when the power supply switch is off by switching on/off of power supply from the DC power source to a power supply line.

However, the wafer may be attracted even when the electrostatic chuck is connected to the ground side and grounded by switching off the power supply switch. The inventors investigated and examined the cause of such a problem, and found that it is due to the effect of a leakage current from the heater embedded in the dielectric. In other words, when the heater is operating, the leakage current flows from the heater into the dielectric, and the electrode is charged through an intrinsic resistance of the dielectric. Accordingly, an electrostatic force is generated, and the wafer is attracted. Since a voltage-drop resistor is disposed on the ground side in the power feeder to protect the power supply, the residual charges in the dielectric are not completely released to the ground side, which causes charge-up of the electrode.

Therefore, the technique of the present disclosure prevents, in an electrostatic attraction device such as an electrostatic chuck having a heater embedded in a dielectric, the charge-up of the electrode by appropriately performing neutralization even when the leakage current flows from the heater, thereby preventing attraction of the wafer when the power supply is stopped.

Hereinafter, a configuration of the electrostatic attraction device according to the present embodiment will be described with reference to the drawings. In this specification, like reference numerals will be given to like parts having substantially the same function and configuration, and redundant description thereof will be omitted.

<Film Forming Apparatus>

FIG. 1 explains a side section schematically showing a configuration of a film forming apparatus 1 to which an electrostatic attraction device according to the present embodiment is applied. As illustrated in FIG. 1, the film forming apparatus 1 includes a processing chamber 10. The processing chamber 10 is made of, e.g., aluminum and is connected to a ground potential. A space S is formed in the processing chamber 10. An exhaust 11 for reducing the pressure in the space S is connected to an exhaust port 10a at a bottom portion of the processing chamber 10 through an adapter 12. Further, an opening 10b for transferring a wafer W and a gate valve 13 for opening and closing the opening 10b are formed on a sidewall of the processing chamber 10.

A substrate support 15 on which the wafer W is placed is disposed in the processing chamber 10. The substrate support 15 has an electrostatic attraction device 50. A configuration of the electrostatic attraction device 50 will be described in detail later.

The substrate support 15 is connected to a substrate support driving mechanism 17 through a support shaft 16. Accordingly, the substrate support 15 is rotatable and vertically movable.

A rotatable gas supply head 18 is disposed in the processing chamber 10. The gas supply head 18 is connected to a head driving mechanism 20 through a support shaft 19. Accordingly, the gas supply head 18 can supply a predetermined gas, e.g., an oxidizing gas from a gas supply source 21 to the wafer W at a position covering the wafer W on the substrate support 15. Further, when the wafer W is transferred to and from the substrate support 15 by a transfer mechanism (not shown), the gas supply head 18 can rotate and move to a position where it does not interfere with the transfer mechanism.

Metal targets 30 and 32 are disposed above the substrate support 15. The metal targets 30 and 32 can be arbitrarily selected depending on a type of a metal oxide layer to be formed. The metal targets 30 and 32 are held by the holders 31 and 33, respectively. The metal targets 30 and 32 are connected to the DC power supplies 34 and 35 through the holders 31 and 33, respectively.

A gas supplier 38 is disposed between the metal targets 30 and 32 at an upper portion of the processing chamber 10, and a predetermined gas, e.g., argon gas, can be supplied from a gas supply source 39 toward the substrate support 15.

<Electrostatic Attraction Device>

Figure 2:
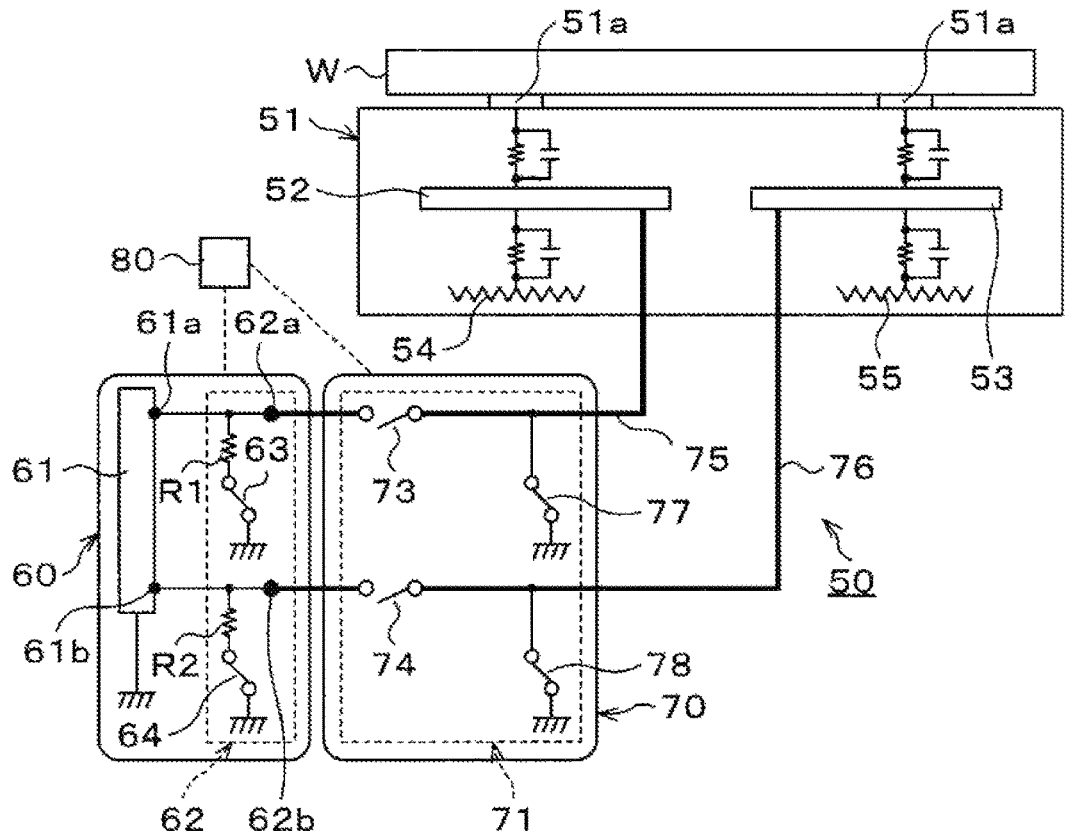
FIG. 2 illustrates a schematic configuration of the electrostatic attraction device according to the embodiment.

As shown in FIG. 2, the electrostatic attraction device 50 includes an electrostatic chuck 51 made of a dielectric, e.g., ceramic such as aluminum nitride or the like. The electrostatic attraction device 50 further includes a DC power source unit 60 for supplying a DC power to the electrostatic chuck 51. The DC power source unit 60 includes a DC power source 61 and a first neutralizing circuit 62. The electrostatic attraction device 50 further includes an intermediate grounding device 70. The intermediate grounding device 70 includes a second neutralizing circuit 71.

Pads 51a for directly supporting the wafer W while maintaining a minute distance from the wafer W are provided on the upper surface of the electrostatic chuck 51.

A pair of electrodes 52 and 53 are disposed in the electrostatic chuck 51. In other words, the electrostatic chuck 51 is configured as an electrostatic chuck having so-called bipolar electrodes. Heaters 54 and 55 for generating heat by power supplied from a power supply (not shown) are disposed below the electrodes 52 and 53 in the electrostatic chuck 51.

The DC power source 61 of the DC power source unit 60 has an anode side terminal 61a and a cathode side terminal 61b. An external terminal 62a for rendering an output is electrically connected to the anode side terminal 61a. One end of a ground relay 63 is connected between the anode side terminal 61a and the external terminal 62a through a voltage-drop resistor R1, and the other end of the ground relay 63 is connected to the ground side. An external terminal 62b for rendering an output is connected to the cathode side terminal 61b. One end of the ground relay 64 is connected between the cathode side terminal 61b and the external terminal 62b through a voltage-drop resistor R2, and the other end of the ground relay 64 is connected to the ground side. The ground relays 63 and 64 whose other ends are connected to the ground side, and the voltage-drop resistors R1 and R2 disposed on one end sides of the ground relays 63 and 64 constitute the first neutralizing circuit 62.

The second neutralizing circuit 71 in the intermediate grounding device 70 has an isolation relay 73, one end side of which is connected to the external terminal 62a of the DC power source unit 60, and an isolation relay 74, one end side of which is connected to the external terminal 62b of the DC power source unit 60. The other end side of the isolation relay 73 is electrically connected to the electrode 52 in the electrostatic chuck 51 through a conductive path 75 as a power supply path. The other end side of the isolation relay 74 is electrically connected to the electrode 53 in the electrostatic chuck 51 through a conductive path 76 as a power supply path.

In the second neutralizing circuit 71 in the intermediate grounding device 70, one end side of the ground relay 77 is connected to the conductive path 75 between the isolation relay 73 and the electrode 52, and the other end side of the ground relay 77 is connected to the ground side. Further, one end side of the ground relay 78 is connected to the conductive path 76 between the isolation relay 74 and the electrode 53, and the other end side of the ground relay 78 is connected to the ground side. No resistance member is particularly disposed in the conductive path to the ground side of the ground relay 77 system and the conductive path to the ground side of the ground relay 78 system, and the intrinsic resistances of the conductive paths are minimized.

A controller 80 controls ON-OFF of the DC power source in the DC power source unit 60, connection and disconnection (i.e., ON-OFF) of the ground relays 63 and 64 in the first neutralizing circuit 62, connection and disconnection (i.e., ON-OFF) of the isolation relays 73 and 74 in the second neutralizing circuit 71 in the intermediate grounding device 70, and connection and disconnection (i.e., ON-OFF) of the ground relays 73 and 74 in the second neutralizing circuit 71. Such control is performed using a computer, but ON-OFF of each relay may be controlled by hardware by means of a dedicated mechanical relay using a solenoid or the like. Such control is not limited to hardware control, and electronic control may be performed.

<Neutralization Method>

The electrostatic attraction device 50 according to the present embodiment has the above-described configuration. Hereinafter, an example of the neutralization method using the electrostatic attraction device 50 will be described.

As shown in FIG. 2, conventionally, equivalent circuits, each including a resistor and a capacitor, exist between the heaters 54 and 55 and the electrodes 52 and 53 and between the electrodes 52 and 53 and the surface of the electrostatic chuck 51, due to the heaters 54 and 55 embedded in the electrostatic chuck 51. Therefore, even if the electrodes 52 and 53 and the DC power source 61 are disconnected, the electrostatic chuck 51 is charged up due to the leakage current from the heaters 54 and 55 and the intrinsic resistances between the heaters 54 and 55 and the surface of the electrodes and the electrostatic chuck 51. In addition, on the surface of the electrostatic chuck 51, positive charges are collected on the electrode 52 side and negative charges are collected on the electrode 53 side. Accordingly, an electrostatic force acts between the electrostatic chuck 51 and the wafer W, and the attraction of the wafer W may not be released in some cases.

However, in accordance with the electrostatic attraction device 50 according to the embodiment, it is possible to prevent the charge-up of the electrostatic chuck 51 even when there is a leakage current from such heaters 54 and 55. Hereinafter, an example of the sequence will be described.

Figure 3:
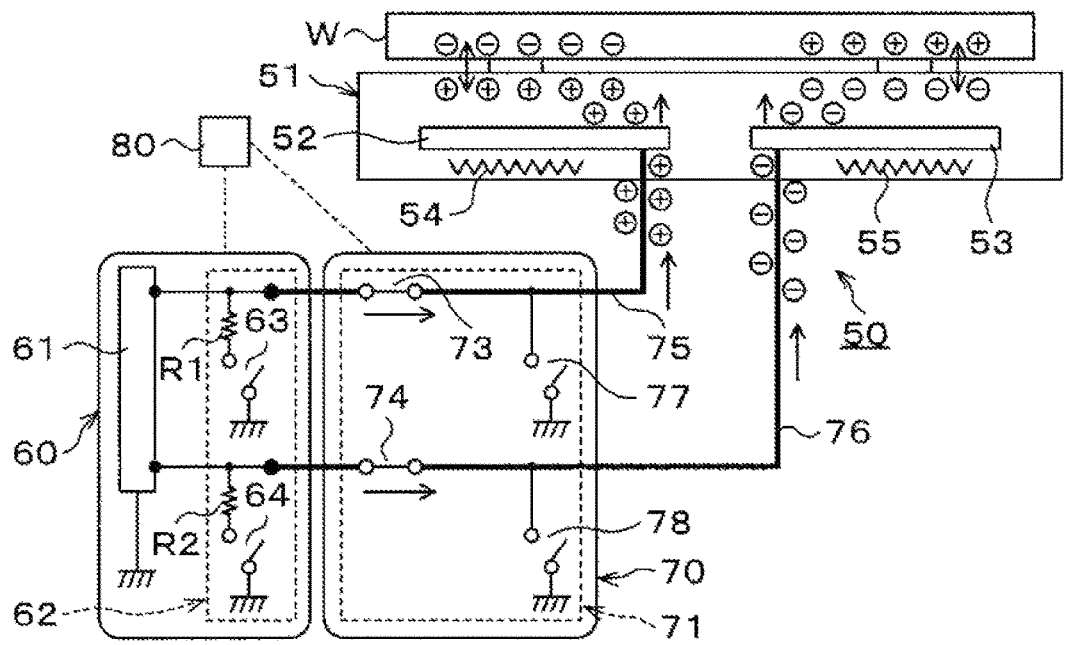
FIG. 3 shows a state in which an electrostatic chuck is operating in the electrostatic attraction device of FIG. 2.

First, FIG. 3 shows a state in which the electrostatic chuck 51 is operating. In other words, as shown in FIG. 3, in the first neutralizing circuit 62 in the DC power source unit 60, the ground relays 63 and 64 are set to an open state (disconnected state). In the second neutralizing circuit 71 in the intermediate grounding device 70, the isolation relays 73 and 74 are in a closed state (connected state), and the ground relays 77 and 78 are set to an open state (disconnected state).

When the DC power source 61 of the DC power source unit 60 is switched on in this state, a DC current flows from the isolation relay 73 to the electrode 52 through the conductive path 75, and positive charges are collected on the electrode 52. Accordingly, positive charges are collected on the surface of the electrostatic chuck 51 above the electrode 52. On the other hand, on the cathode side, negative charges are collected on the surface of the electrostatic chuck 51 above the electrode 53 through the conductive path 76. In this manner, the positive charges and the negative charges are collected on different regions of the surface of the electrostatic chuck 51, and the wafer W is attracted on the electrostatic chuck 51 by the Johnson-Rahbek force.

Figure 4:
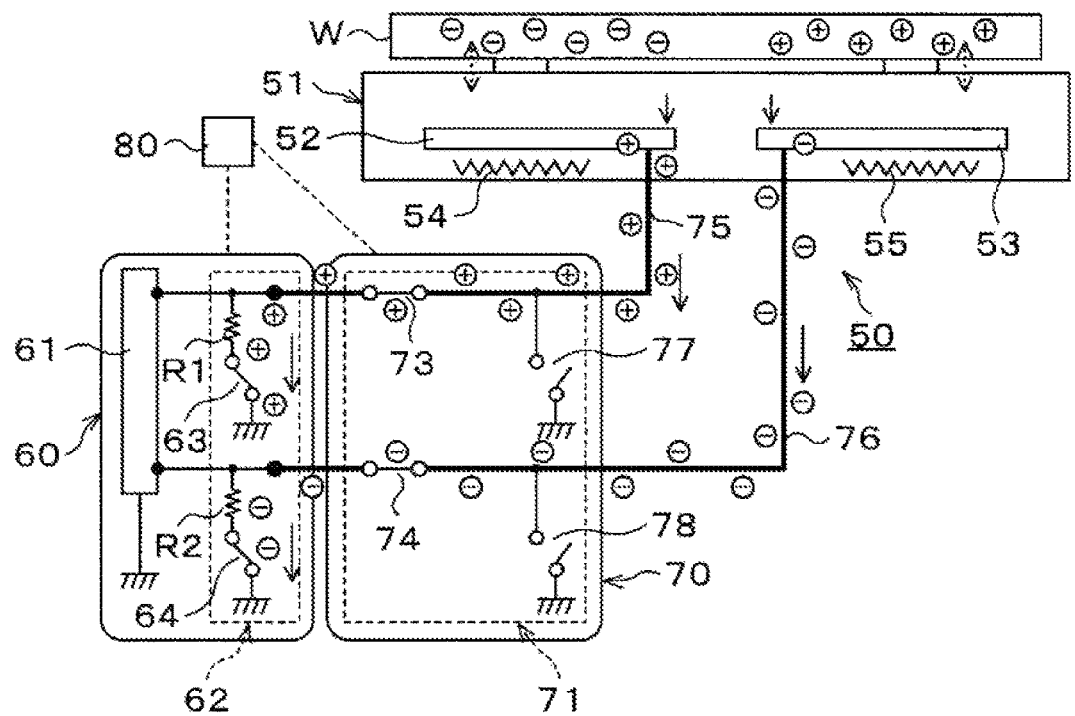
FIG. 4 presents a state in which a first neutralization step is being executed in the electrostatic attraction device of FIG. 2.

Next, in the case of releasing the operating state of the electrostatic chuck 51, i.e., in the case of stopping the operation of the electrostatic chuck 51, first, the DC power source 61 of the DC power source unit 60 is switched off. At the same time, as shown in FIG. 4, in the second neutralizing circuit 71 in the intermediate grounding device 70, the isolation relays 73 and 74 are maintained in the closed state (connected state), and the ground relays 77 and 78 are maintained in the open state (disconnected state). On the other hand, in the first neutralizing circuit 62 in the DC power source unit 60, the ground relays 63 and 64 are set to a closed state (connected state).

Accordingly, a first neutralization step is executed by the first neutralizing circuit, so that the positive charges of the electrode 52 flow through the conductive path 75, the isolation relay 73, and the ground relay 63 of the first neutralizing circuit to the ground side. Further, the negative charges of the electrode 53 flow through the conductive path 76, the isolation relay 74, and the ground relay 64 of the first neutralizing circuit to the ground side.

Figure 5:
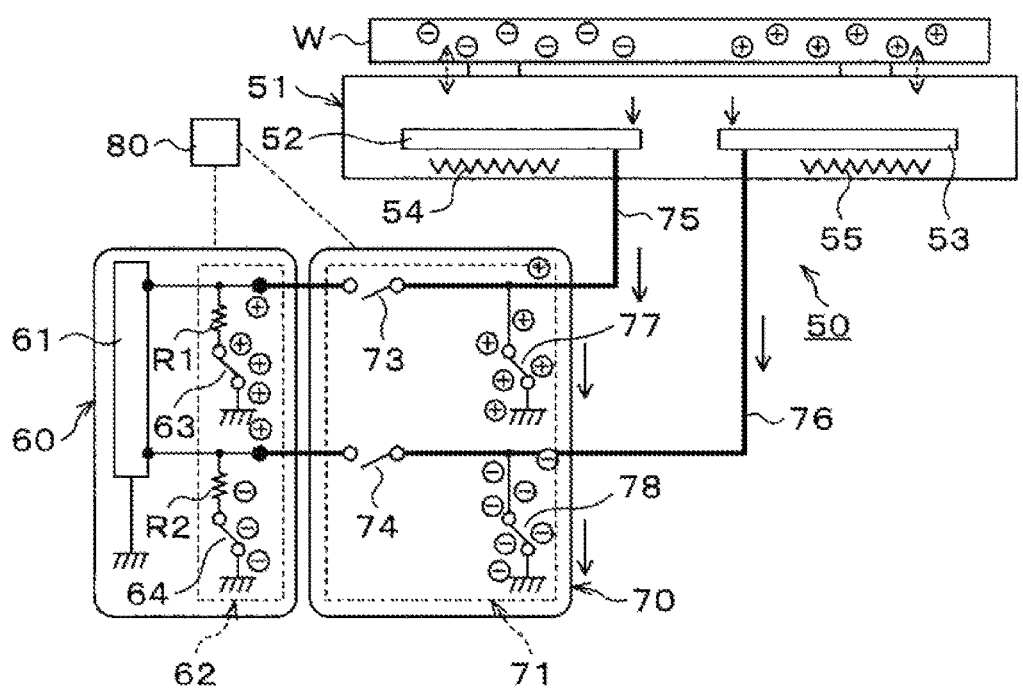
FIG. 5 provides a state in which a second neutralization step is being executed in the electrostatic attraction device of FIG. 2.

After the step of discharging the charges through the ground relays 63 and 64 of the first neutralizing circuit is executed for a predetermined period of time, the second neutralization step is executed by the second neutralizing circuit 71. In other words, as shown in FIG. 5, the ground relays 63 and 64 in the first neutralizing circuit are maintained in the closed state (connected state). On the other hand, in the second neutralizing circuit 71 in the intermediate grounding device 70, the isolation relays 73 and 74 are set to the open state (disconnected state), and the ground relays 77 and 78 are set to the closed state (connected state).

Accordingly, the second neutralization step is executed by the second neutralizing circuit 71.

In other words, in the first neutralizing circuit 62 in the DC power source unit 60, the residual charges in the DC power source unit 60 are discharged to the ground side through the ground relays 63 and 64. On the other hand, in the second neutralizing circuit 71 in the intermediate grounding device 70, the isolation relays 73 and 74 are in the open state (disconnected state), so that the DC power source unit 60 and the intermediate grounding device 70 are completely isolated from each other.

In the second neutralizing circuit 71 of the intermediate grounding device 70, the ground relays 77 and 78 are in the closed state (connected state), and no resistance element is particularly disposed in the conductive paths of the ground relays 77 and 78 system. Therefore, the charges flow very easily. Accordingly, when the charges flow through the conductive paths 75 and 76 electrically connected to the ground relays 77 and 78, respectively, the charges can be quickly released from the ground relays 77 and 78 to the ground side.

Therefore, even if the leakage current from the heaters 54 and 55 flows through the electrostatic chuck 51, for example, the charges at that time can be quickly released to the ground side through the ground relays 77 and 78. Therefore, the charge-up of the electrostatic chuck 51 due to the leakage current from the heaters 54 and 55 is prevented.

In the above-described embodiment, since the second neutralizing circuit 71 is disposed in the intermediate grounding device 70, the second neutralization step can be executed by separating the intermediate grounding device 70 from the DC power source unit 60 and connecting the intermediate grounding device 70 to the DC power source unit including DC power sources having different voltages, for example. Therefore, the electrostatic attraction device 50 according to the embodiment is highly versatile. It is also possible to provide the second neutralizing circuit 71 in the DC power source unit 60.

The controller 80 controls the above neutralization sequence, i.e., the sequence of executing the first neutralization step and then executing the second neutralization step after elapse of a predetermined period of time. However, such control may be performed based on, e.g., a preset program. The predetermined period of time is set based on the type of the DC power source 61, the material of the electrostatic chuck 51, the arrangement of the electrodes 52 and 53, the types and arrangement of the heaters 54 and 55, and the like. Further, the program is stored in a program storage (not shown) in the controller 80, but may be recorded in a computer-readable storage medium and installed from the storage medium in the controller 89.

The embodiments of the present disclosure are illustrative in all respects and are not restrictive. The above-described embodiments can be embodied in various forms.

Further, the above-described embodiments may be omitted, replaced, or changed in various forms without departing from the scope of the appended claims and the gist thereof.

The following configurations are also included in the technical scope of the present disclosure.

(1) An electrostatic attraction device having an electrostatic chuck in which an electrode and a heater are embedded in a dielectric, comprising:

a DC power source unit having a DC power source configured to supply a DC power to the electrode;

a first neutralizing circuit connected to a power supply path between the DC power source and the electrode; and a second neutralizing circuit connected to a power supply path between the first neutralizing circuit and the electrode, wherein the first neutralizing circuit has a first ground relay that connects and disconnects the electrode and the ground via a voltage-drop resistance member, and the second neutralizing circuit has an isolation relay that connects and disconnects the first neutralizing circuit and the second neutralizing circuit, and a second ground relay that is connected to a power supply path between the isolation relay and the electrode and connects and disconnects the electrode and the ground side without going through a resistance member.

(2) The electrostatic attraction device of (1), wherein the first neutralizing circuit is disposed in the DC power source unit.

(3) The electrostatic attraction device of (1) or (2), wherein the second neutralizing circuit is disposed in an intermediate grounding device between the DC power source unit and the electrode.

(4) The electrostatic attraction device of any one of (1) to (3), further comprising a controller configured to control connection and disconnection of the first ground relay, the second ground relay, and the isolation relay.

(5) A neutralization method for an electrostatic chuck using the electrostatic attraction device recited in any one of (1) to (4), comprising:
a first neutralization step of neutralizing charges of the electrostatic chuck using the first neutralizing circuit at the same time with or after stopping supply of a DC power to the electrode; and
a second neutralization step of separating the first neutralizing circuit from the power supply path after the first neutralizing step, and neutralizing charges of the electrostatic chuck using the second neutralizing circuit, at the same time with or after a predetermined period of time from the separating.

DESCRIPTION OF REFERENCE NUMERALS

1: film forming apparatus
10: processing chamber
10a: exhaust port
10b: opening
11: exhaust
12: adapter
13: gate valve
15: substrate support
17: substrate support driving mechanism
18: gas supply head
20: head driving mechanism
30, 32: metal targets
31, 33: holders
38: gas supplier
39: gas supply source
50: electrostatic attraction device
51: electrostatic chuck
52, 53: electrodes
60: DC power source unit
61: DC power source
62: first static eliminator
63, 64: ground relays
70: intermediate grounding device
71: second static eliminator
73, 74: isolation relays
75, 76: conductive paths
77, 78: ground relays 80: controller
R1, R2: voltage-drop resistors
S: space
W: wafer

The invention claimed is:

1. An electrostatic attraction device having an electrostatic chuck in which an electrode and a heater are embedded in a dielectric, comprising:
a DC power source unit having a DC power source configured to supply a DC power to the electrode;
a first neutralizing circuit connected to a power supply path between the DC power source and the electrode; and
a second neutralizing circuit connected to a power supply path between the first neutralizing circuit and the electrode,
wherein the first neutralizing circuit has a first ground relay that connects and disconnects the electrode and the ground via a voltage-drop resistance member, and
the second neutralizing circuit has an isolation relay that connects and disconnects the first neutralizing circuit and the second neutralizing circuit, and a second ground relay that is connected to a power supply path between the isolation relay and the electrode and connects and disconnects the electrode and the ground side without going through a resistance member.

2. The electrostatic attraction device of claim 1, wherein the first neutralizing circuit is disposed in the DC power source unit.

3. The electrostatic attraction device of claim 1, wherein the second neutralizing circuit is disposed in an intermediate grounding device between the DC power source unit and the electrode.

4. The electrostatic attraction device of claim 1, further comprising:
a controller configured to control connection and disconnection of the first ground relay, the second ground relay, and the isolation relay.

5. A neutralization method for an electrostatic chuck using the electrostatic attraction device recited in claim 1, comprising:
a first neutralization step of neutralizing charges of the electrostatic chuck using the first neutralizing circuit at the same time with or after stopping supply of a DC power to the electrode; and
a second neutralization step of separating the first neutralizing circuit from the power supply path after the first neutralizing step, and neutralizing charges of the electrostatic chuck using the second neutralizing circuit, at the same time with or after a predetermined period of time from the separating.

6. A neutralization method for an electrostatic chuck using the electrostatic attraction device recited in claim 2, comprising:
a first neutralization step of neutralizing charges of the electrostatic chuck using the first neutralizing circuit at the same time with or after stopping supply of a DC power to the electrode; and
a second neutralization step of separating the first neutralizing circuit from the power supply path after the first neutralizing step, and neutralizing charges of the electrostatic chuck using the second neutralizing circuit, at the same time with or after a predetermined period of time from the separating.

7. A neutralization method for an electrostatic chuck using the electrostatic attraction device recited in claim 3, comprising:
- a first neutralization step of neutralizing charges of the electrostatic chuck using the first neutralizing circuit at the same time with or after stopping supply of a DC power to the electrode; and
- a second neutralization step of separating the first neutralizing circuit from the power supply path after the first neutralizing step, and neutralizing charges of the electrostatic chuck using the second neutralizing circuit, at the same time with or after a predetermined period of time from the separating.

8. A neutralization method for an electrostatic chuck using the electrostatic attraction device recited in claim 4, comprising:
- a first neutralization step of neutralizing charges of the electrostatic chuck using the first neutralizing circuit at the same time with or after stopping supply of a DC power to the electrode; and
- a second neutralization step of separating the first neutralizing circuit from the power supply path after the first neutralizing step, and neutralizing charges of the electrostatic chuck using the second neutralizing circuit, at the same time with or after a predetermined period of time from the separating.

* * * * *